United States Patent
Askan

(10) Patent No.: US 11,948,768 B2
(45) Date of Patent: Apr. 2, 2024

(54) MECHATRONIC MODULE HAVING A HYBRID CIRCUIT ARRANGEMENT

(71) Applicant: Eaton Intelligent Power Limited, Dublin (IE)

(72) Inventor: Kenan Askan, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 990 days.

(21) Appl. No.: 16/764,407

(22) PCT Filed: Nov. 9, 2018

(86) PCT No.: PCT/EP2018/080778
§ 371 (c)(1),
(2) Date: Aug. 4, 2020

(87) PCT Pub. No.: WO2019/096692
PCT Pub. Date: May 23, 2019

(65) Prior Publication Data
US 2020/0357582 A1 Nov. 12, 2020

(30) Foreign Application Priority Data
Nov. 17, 2017 (DE) ................ 10 2017 127 076.0

(51) Int. Cl.
*H01H 9/54* (2006.01)
*H01H 9/02* (2006.01)
(Continued)

(52) U.S. Cl.
CPC .............. *H01H 9/548* (2013.01); *H01H 9/02* (2013.01); *H01H 89/00* (2013.01);
(Continued)

(58) Field of Classification Search
CPC .......... H01H 9/548; H01H 9/02; H01H 89/00; H05K 1/0306; H05K 1/181
See application file for complete search history.

(56) References Cited

U.S. PATENT DOCUMENTS

| 5,296,739 A | 3/1994 | Frank et al. |
| 8,319,335 B2 * | 11/2012 | Bayerer ............. H01L 23/4952 257/565 |

(Continued)

FOREIGN PATENT DOCUMENTS

| DE | 4122428 A1 | 1/1993 |
| DE | 102009002993 A1 | 11/2010 |

(Continued)

OTHER PUBLICATIONS

EP2782131, machine translation. (Year: 2014).*

*Primary Examiner* — Kyung S Lee
(74) *Attorney, Agent, or Firm* — LEYDIG, VOIT & MAYER, LTD.

(57) ABSTRACT

A mechatronic module includes: a hybrid circuit arrangement having at least one interrupter, which interrupter includes at least one first mechanical switch and at least one first semiconductor circuit arrangement. The hybrid circuit arrangement is situated on a first face of a ceramic substrate, a second face, opposite the first face, of the ceramic substrate being connected to a metal plate. A housing shell is fastened to the metal plate and encloses the ceramic substrate and the hybrid circuit arrangement. The metal plate and the housing shell form a housing of the mechatronic module. Interstices within the housing are filled at least in some regions with a potting compound.

14 Claims, 2 Drawing Sheets

(51) Int. Cl.
    *H01H 89/00*     (2006.01)
    *H05K 1/03*       (2006.01)
    *H05K 1/18*       (2006.01)

(52) U.S. Cl.
    CPC .......... H05K 1/0306 (2013.01); H05K 1/181 (2013.01); *H05K 2201/10053* (2013.01); *H05K 2201/10166* (2013.01)

(56) References Cited

U.S. PATENT DOCUMENTS

| | | |
|---|---|---|
| 2009/0161277 A1 | 6/2009 | Roesner et al. |
| 2010/0127371 A1 | 5/2010 | Tschirbs |
| 2010/0284155 A1 | 11/2010 | Hohlfeld et al. |
| 2014/0313628 A1 | 10/2014 | Hassanpoor et al. |
| 2018/0301295 A1* | 10/2018 | Dupraz ................ H01H 33/596 |

FOREIGN PATENT DOCUMENTS

| | | | |
|---|---|---|---|
| EP | 2782131 A2 | 9/2014 | |
| EP | 3373317 A1 * | 9/2018 | |
| EP | 3429045 A1 * | 1/2019 | ............... H02H 1/06 |
| WO | WO 2015028634 A1 | 3/2015 | |

\* cited by examiner

MECHATRONIC MODULE HAVING A HYBRID CIRCUIT ARRANGEMENT

CROSS-REFERENCE TO PRIOR APPLICATIONS

This application is a U.S. National Phase application under 35 U.S.C. § 371 of International Application No. PCT/EP2018/080778, filed on Nov. 9, 2018, and claims benefit to German Patent Application No. DE 10 2017 127 076.0, filed on Nov. 17, 2017. The International Application was published in German on May 23, 2019 as WO 2019/096692 under PCT Article 21(2).

FIELD

The invention relates to a mechatronic module.

BACKGROUND

So-called hybrid switching devices are known which have both mechanical switches and semiconductor switches. Such a switching device is known, e.g., from WO 2015/028634 A1. These switching devices differ greatly from purely mechanical switching devices which, in practice, lead to entirely different requirements with regard to the electromechanical design.

In hybrid switching devices, usually a plurality of mechanical contact pairs lie serially in the current path through the switching device. This frequently results in a higher resistance and a higher self-heating. At the same time, power semiconductors are central components which are essential for switching off the currents by the hybrid switching device. However, high ambient temperatures reduce the lifespan of semiconductor switches. A malfunction of the semiconductor switches would mean that a current would only have to be switched off by the bypass relay which is arranged parallel to the semiconductor switches and which is simply not designed for such purpose, and which also has no associated arc control device. Without functioning semiconductor switches, the bypass relay will be destroyed explosively during the attempt to switch off a high current, e.g., a short-circuit current in a typical low voltage installation environment.

Furthermore, different temperature levels within the switching device can result in an impairment of the function of the hybrid switching device.

It has further been shown that the actual electromechanical design significantly influences the functionality of the hybrid circuit arrangement, particularly its ability to safely switch off short-circuit currents with several thousand amperes.

SUMMARY

In an embodiment, the present invention provides a mechatronic module, comprising: a hybrid circuit arrangement comprising at least one interrupter, which interrupter comprises at least one first mechanical switch and at least one first semiconductor circuit arrangement, wherein the hybrid circuit arrangement is situated on a first face of a ceramic substrate, a second face, opposite the first face, of the ceramic substrate being connected to a metal plate, wherein a housing shell is fastened to the metal plate and encloses the ceramic substrate and the hybrid circuit arrangement, wherein the metal plate and the housing shell form a housing of the mechatronic module, and wherein interstices within the housing are filled at least in some regions with a potting compound.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a mechatronic module of the initially described type, with which the aforementioned disadvantages of hybrid switching devices can be prevented, and with which an electrical protection can be ensured over a long period of time.

As a result, an electrical protection can be ensured over a long period of time, and in case of a failure of the first semiconductor arrangement, the environment can be safely protected from the consequences of a destruction of the mechanical switch. With the coupling to the metal plate, an even temperature can be achieved within the mechatronic module. The surface of the metal plate, which is free toward the outside, can emit heat to the environment in a favorable manner. With the sum of the measures according to the invention, it is possible to create a real design of a hybrid circuit arrangement that is durable and functionally reliable.

Figure 1:
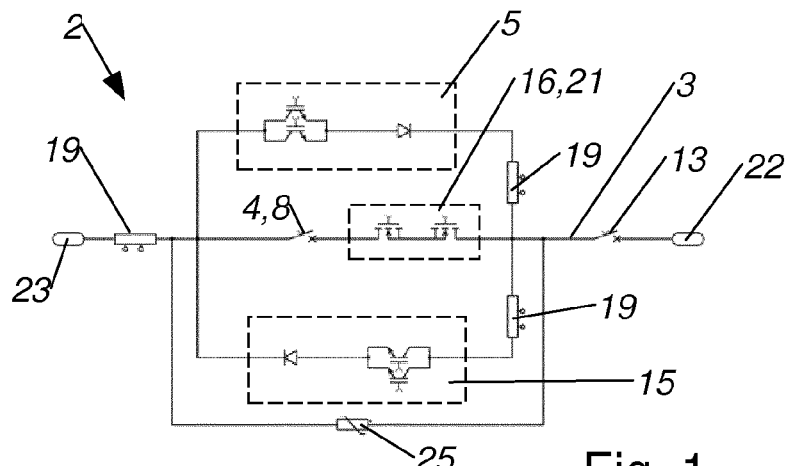
FIG. 1 shows a circuit diagram of an embodiment of a hybrid circuit arrangement according to the invention.

FIG. 1 shows a circuit diagram of a hybrid circuit arrangement 2 as it is provided particularly as part of a hybrid circuit breaker, particularly a low voltage circuit-protection device. The concrete circuit design described below is an example, wherein types of hybrid circuit arrangements deviating therefrom can also be provided, particularly if they are suitable as the main interrupter of a circuit breaker.

The hybrid circuit arrangement 2 according to the invention has at least one interrupter 3, wherein further interrupters can also be provided. It can be provided that interrupters for outer conductors are designed and/or operated differently than interrupters for neutral conductors.

In the first interrupter 3, a first mechanical switch 4 is arranged which, in the circuit layout according to the invention, can be called a bypass switch 8. A first semiconductor circuit arrangement 5, which comprises power semiconductor switching elements, such as IGBT, is arranged, circuitry-wise, parallel to the first switch 4. According to a particularly preferred embodiment, a second semiconductor circuit arrangement 15, which also has corresponding power semiconductor switching elements, is additionally connected parallel to the bypass switch 8. For this purpose, it is preferably provided that a flow direction of the second semiconductor circuit arrangement 15 is opposite of a flow direction of the first semiconductor circuit arrangement 5.

A varistor 25 is arranged parallel to said circuit arrangement.

The hybrid circuit arrangement 2 is assigned an electronic control unit 26 which, however, is arranged outside of the mechatronic module 1 according to the invention. It is used to control the mechanical and electrical switches. The electronic control unit 26 is preferably arranged outside on the housing shell 11.

The hybrid circuit arrangement 2 has at least one shunt 19 of a current measuring arrangement. The presently depicted embodiment has three shunts 19.

Furthermore, the hybrid circuit arrangement 2 preferably has a second mechanical switch 13 which in the present embodiment is used for a galvanic separation after a completed shutdown.

The hybrid circuit arrangement 2 can also be designed in an entirely deviating manner, wherein the actual switching process of the current takes place entirely without mechanical switches, wherein the bypass switch 8 is subsequently omitted. In such so-called solid state circuit breakers, the first mechanical switch 4 assumes the function of the galvanic separation which, according to FIG. 1, is performed by the second mechanical switch 13.

Furthermore, the hybrid circuit arrangement 2 preferably has a third semiconductor circuit arrangement 16 which is designed to comprise MosFETs 21 and which is connected serially to the first mechanical switch 4 and parallel-connected to the first semiconductor circuit arrangement 5. This third semiconductor circuit arrangement 16 allows for a separation of the contacts of the bypass switch 8 without arcs, but for the concept according to FIG. 1, it is not absolutely necessary.

Figure 2:
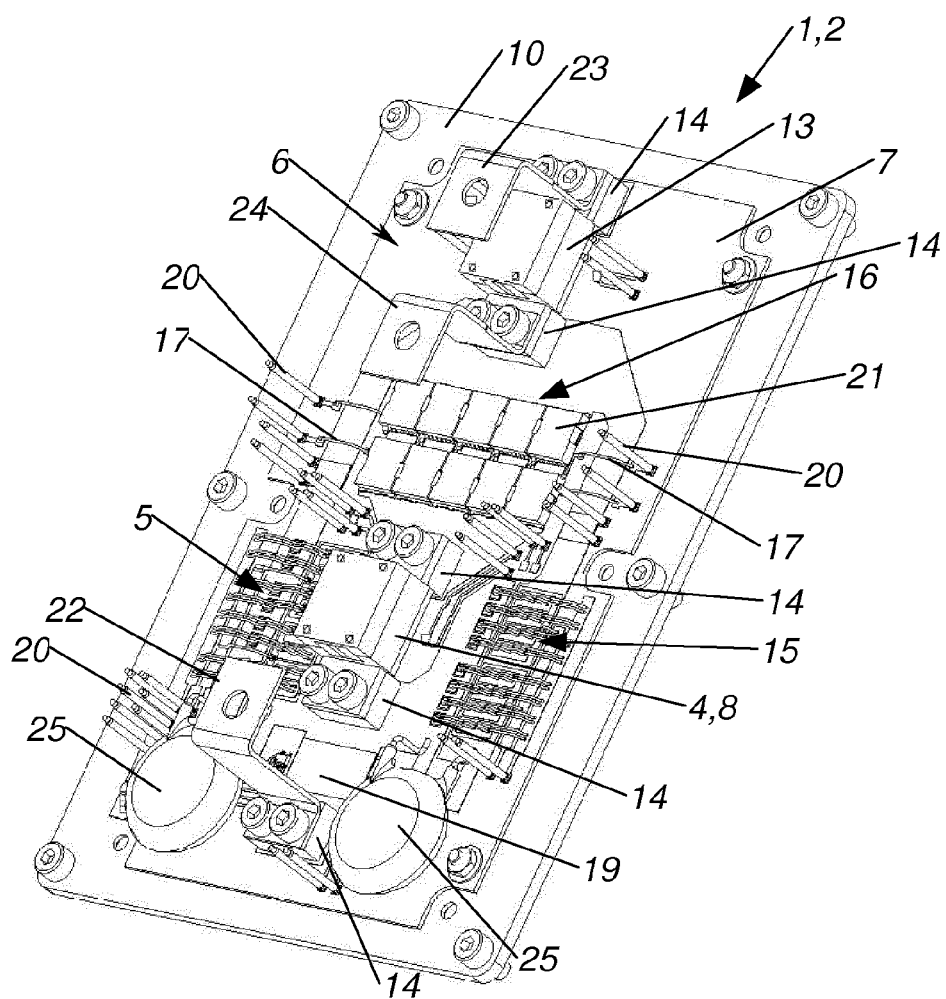
FIG. 2 shows an axonometric depiction of a mechatronic module according to the invention without a housing shell.
Figure 3:
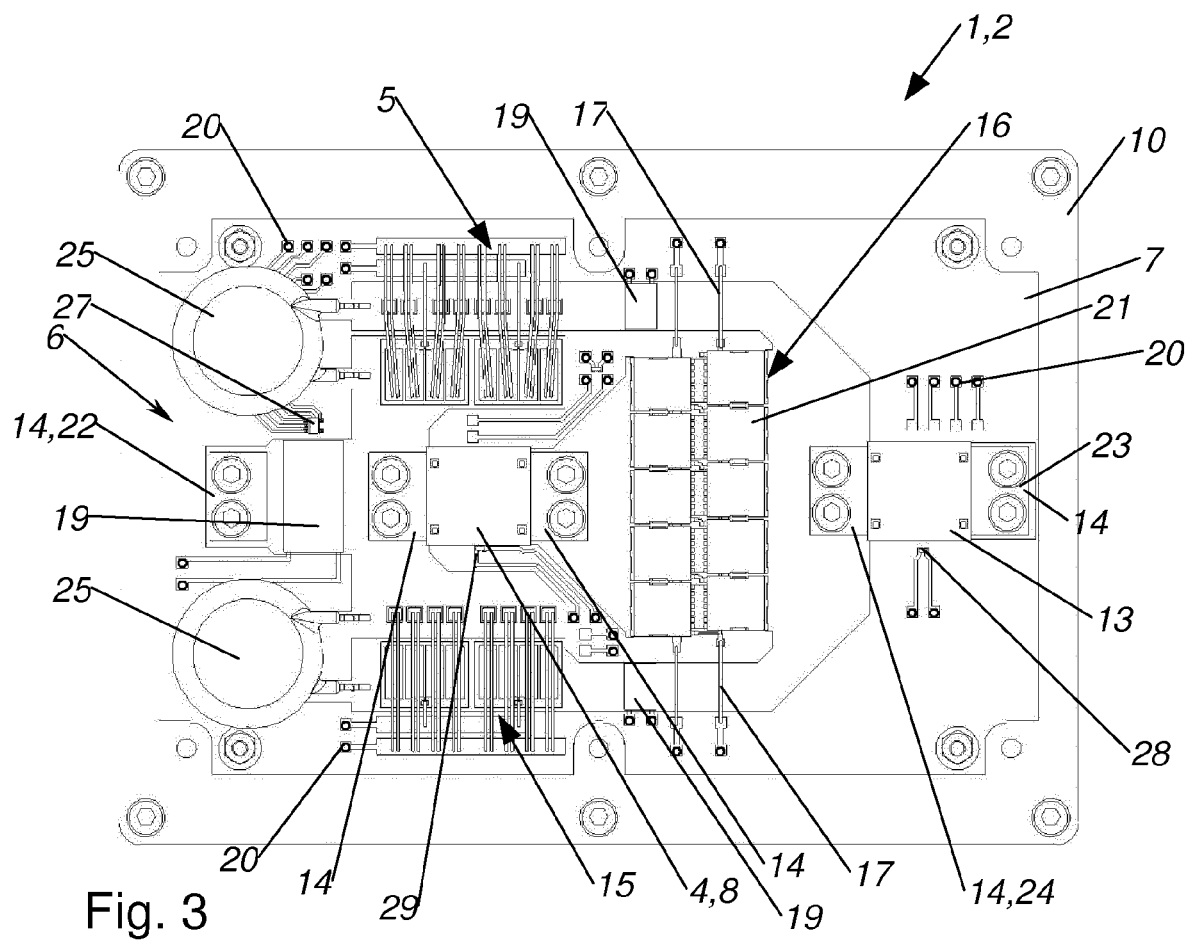
FIG. 3 shows a plan view of the mechatronic module according to FIG. 2.
Figure 4:
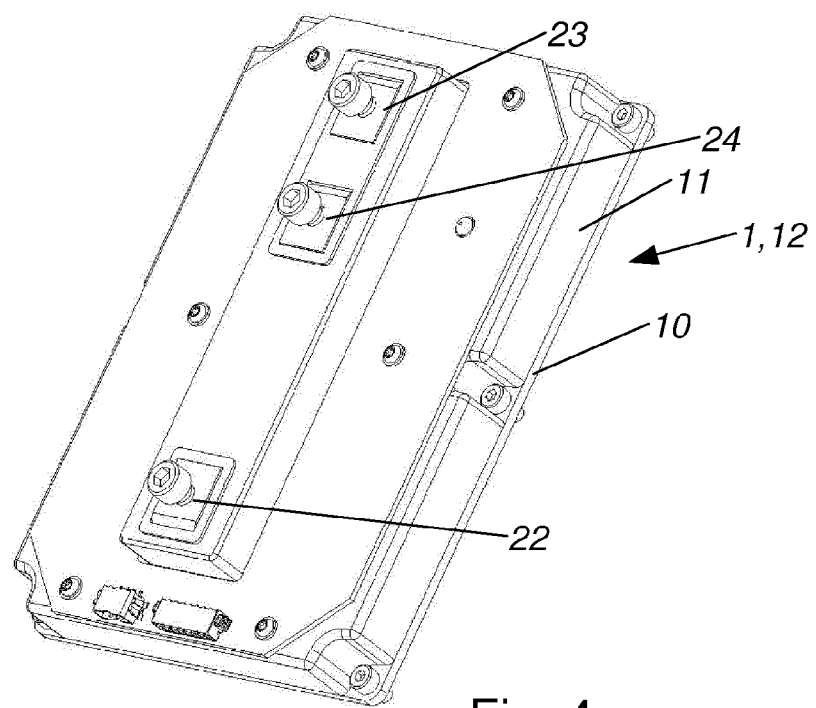
FIG. 4 shows an axonometric depiction of the mechatronic module according to FIG. 2 with a closed housing.

FIGS. 2 to 4 each show different views of a mechatronic module 1 with a hybrid circuit arrangement 2 as described above by way of example, but which has at least one interrupter 3 with a first mechanical switch 4 and a first semiconductor circuit arrangement 5. The respective drawings further show the optional second semiconductor circuit arrangement 15. The hybrid circuit arrangement 2 is situated on a first face 6 of a ceramic substrate 7, e.g., Al$_2$O$_3$ or AlN. In this case, the ceramic substrate 7 can simply also be part of a larger component carrier.

A second face, opposite the first face 7, of the ceramic substrate 7 is connected to a metal plate 10, in particular a copper plate, aluminum plate, or silver plate. Particularly preferably, it is provided that, on a face facing away from the ceramic substrate 7, the metal plate 10 is connected to a cooling element.

It is preferably provided that the ceramic substrate 7 is connected to the metal plate 10 essentially with its entire surface. For this purpose, it is further provided that the ceramic substrate 7 is essentially directly connected to the metal plate 10, wherein a heat-conducting paste or the like can be arranged between them.

Furthermore, it can be provided that the metal plate 10 is part of a cooling element.

A housing shell 11 is fastened to the metal plate 10 and encloses the ceramic substrate 7 and the hybrid circuit arrangement 2, wherein the metal plate 10 and the housing shell 11 thus form a housing 12 of the mechatronic module 1. The housing shell 11 is preferably formed from an electrically insulating plastic. The housing shell 11 is preferably screwed to the metal plate 10.

Interstices within the housing 12 are filled at least in some regions with a potting compound, wherein it is particularly provided that said interstices are filled with SilGel, but wherein other potting compounds, e.g., on epoxy basis, can be provided. In addition, a vacuum potting is preferably provided.

As was already mentioned in the introductory part, the actual arrangement of the components and the concept of the electromechanical design is important for the functioning of the hybrid circuit arrangement 2 in actuality. In this regard, the measures described in the following have proven to be very advantageous.

It is preferably provided that the first mechanical switch 4, which is preferably designed as a bypass switch 8, is situated on the ceramic substrate 7 in the area of a center of the ceramic substrate 7. As a result, it is possible to arrange the further components around this central component. This has proven to be important or advantageous because, as a result, the line lengths can be kept short, and mainly because the loop inductance of individual circuit components can be kept very short. In this case, the center is particularly the area along an axis of symmetry of the ceramic substrate 7.

If the hybrid circuit arrangement 2 also has a second mechanical switch 13, it is preferably provided that, as can be seen, e.g., in FIG. 3, it is arranged in a line with the first mechanical switch 4.

The switch or switches 4, 8, 13 are preferably not situated directly on the ceramic substrate 7. For this purpose, it is preferably provided that a predeterminable number of electrically conducting fastening blocks 14, particularly metal blocks, preferably copper blocks, are situated on the ceramic substrate 7, and that the first mechanical switch 4 and/or the second mechanical switch 13 are fastened to the fastening blocks 14. In addition, the connecting terminals 22, 23, 24 are arranged on or fastened to such fastening blocks 14.

The connecting terminals 22, 23, 24 are preferably arranged along one row, which makes it easy to parallel-connect a plurality of similar mechatronic modules 1.

Such fastening blocks 14 allow for a secure installation of the switches 4, 8, 13 and the connecting terminals 22, 23, 24. They particularly allow for an exact positioning of the bypass switch 8 which is a precision switch. With the fastening to the fastening blocks 14, it can be prevented that the bypass switch 8 is heated too excessively and thus affected, which would occur in the case when fastening, e.g., by means of soldering. In addition, it can be prevented that it warps. For this purpose, it is particularly preferably provided that the first mechanical switch 4 and/or the second mechanical switch 13 are screwed to the fastening blocks 14.

The first semiconductor circuit arrangement 5 and the second semiconductor circuit arrangement 15, which are preferably designed to comprise IGBTs and serial blocking diodes, are, as shown in FIG. 1, parallel-connected and, as shown in FIGS. 2 and 3, are preferably arranged symmetrically on both sides of the first mechanical switch 4.

The third semiconductor circuit arrangement 16 is preferably arranged between the first and the second switch 4, 13. The third semiconductor circuit arrangement 16 is designed to comprise MosFets 21. The lines 17 are control connections of the MosFets 21.

It has proven particularly advantageous that a MosFet 21 of the third semiconductor circuit arrangement 16 is designed as a safety fuse 18. This refers to the fact that at least one MosFet 21 assumes the function of a safety fuse and will be destroyed in case of a corresponding overload, resulting in the respective line to be interrupted. As a result, the safety of the mechatronic module 1 can be further increased without the requirement of additional components.

Furthermore, it is preferably provided that the hybrid circuit arrangement 2 has at least one shunt 19 of a current measuring arrangement, and that the at least one shunt 19 is designed as a conducting path, particularly comprising silver, of the hybrid circuit arrangement 2. In this respect, a separate component can thus be omitted.

The mechatronic module 1 further has at least one temperature sensor 27 which is preferably arranged in spatial proximity to the at least one shunt 19.

The at least one shunt 19 can also be used to measure energy. In addition to general temperature monitoring, the temperature sensor 27 also allows for the calibration of the shunt 19. In the area of the first or the second mechanical switches 4, 13, two further temperature sensors 28, 29 are preferably arranged in order to also monitor the temperature in the area of the mechanical switches 4, 13.

The mechatronic module 1 further has a predeterminable multiplicity of control connections 20 for connecting the hybrid circuit arrangement 2 to an electronic control unit.

Particularly preferably, it is provided that the power modules of a low voltage circuit-protection device are arranged in a mechatronic module 1 according to the invention.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A mechatronic module, comprising:
   a hybrid circuit arrangement comprising at least one interrupter, which interrupter comprises at least one first mechanical switch and at least one first semiconductor circuit arrangement,
   wherein the hybrid circuit arrangement is situated on a first face of a ceramic substrate, a second face, opposite the first face, of the ceramic substrate being connected to a metal plate,
   wherein a housing shell is fastened to the metal plate and encloses the ceramic substrate and the hybrid circuit arrangement,
   wherein the metal plate and the housing shell form a housing of the mechatronic module,
   wherein interstices within the housing are filled at least in some regions with a potting compound, and
   wherein the hybrid circuit arrangement comprises a second mechanical switch which is arranged to be connected serially to the first mechanical switch and to the first semiconductor circuit arrangement.

2. The mechatronic module according to claim 1, wherein the ceramic substrate is connected to the metal plate essentially with its entire surface.

3. The mechatronic module according to claim 1, wherein, on a face facing away from the ceramic substrate, the metal plate is connected to a cooling element.

4. The mechatronic module according to claim 1, wherein the first mechanical switch comprises a bypass switch and is situated on the ceramic substrate in an area of a center of the ceramic substrate.

5. The mechatronic module according to claim 1, wherein a predeterminable number of electrically conducting fastening blocks are situated on the ceramic substrate, and
   wherein the first mechanical switch and/or the second mechanical switch are fastened to the fastening blocks.

6. The mechatronic module according to claim 5, wherein the first mechanical switch and/or the second mechanical switch are screwed to the fastening blocks.

7. The mechatronic module according to claim 1, wherein the hybrid circuit arrangement comprises a second semiconductor circuit arrangement, and
   wherein the first semiconductor circuit arrangement and the second semiconductor circuit arrangement, which comprise IGBTs and serial blocking diodes, are parallel-connected and arranged symmetrically on both sides of the first mechanical switch.

8. The mechatronic module according to claim 7, wherein the hybrid circuit arrangement comprises a third semiconductor circuit arrangement comprising MosFETs and which is connected serially to the first mechanical switch and parallel-connected to the first semiconductor circuit arrangement.

9. The mechatronic module according to claim 8, wherein one MosFet of the third semiconductor circuit arrangement comprises a safety fuse.

10. The mechatronic module according to claim 1, wherein the hybrid circuit arrangement has at least one shunt of a current measuring arrangement, and
    wherein the at least one shunt comprises a conducting path, comprising silver, of the hybrid circuit arrangement.

11. The mechatronic module according to claim 10, wherein at least one temperature sensor of the mechatronic module is arranged in spatial proximity to the at least one shunt.

12. The mechatronic module according to claim 1, wherein the mechatronic module has a predeterminable multiplicity of control connections for connecting the hybrid circuit arrangement to an electronic control unit.

13. A low voltage circuit-protection device, comprising:
    at least one mechatronic module according to claim 1.

14. A mechatronic module, comprising:
    a hybrid circuit arrangement comprising at least one interrupter, which interrupter comprises at least one first mechanical switch and at least one first semiconductor circuit arrangement,
    wherein the hybrid circuit arrangement is situated on a first face of a ceramic substrate, a second face, opposite the first face, of the ceramic substrate being connected to a metal plate,
    wherein a housing shell is fastened to the metal plate and encloses the ceramic substrate and the hybrid circuit arrangement, wherein the metal plate and the housing shell form a housing of the mechatronic module, wherein interstices within the housing are filled at least in some regions with a potting compound, and wherein the first mechanical switch comprises a bypass switch and is situated on the ceramic substrate in an area of a center of the ceramic substrate, the center being arranged along an axis of symmetry of the ceramic substrate.

* * * * *